United States Patent [19]

Van Nostrand

[11] Patent Number: 5,161,221
[45] Date of Patent: Nov. 3, 1992

[54] MULTI-MEMORY BANK SYSTEM FOR RECEIVING CONTINUOUS SERIAL DATA STREAM AND MONITORING SAME TO CONTROL BANK SWITCHING WITHOUT INTERRUPTING CONTINUOUS DATA FLOW RATE

[75] Inventor: Scott L. Van Nostrand, Rochester, N.Y.

[73] Assignee: Eastman Kodak Company, Rochester, N.Y.

[21] Appl. No.: 282,714

[22] Filed: Dec. 12, 1988

[51] Int. Cl.$^5$ .............................................. G11C 8/00
[52] U.S. Cl. ................................... 395/425; 365/240; 364/DIG. 1; 364/244.5; 340/750
[58] Field of Search ............................ 340/750, 799; 364/200 MS File, 900 MS File, 518; 365/219, 240

[56] References Cited

U.S. PATENT DOCUMENTS

| | | | |
|---|---|---|---|
| 4,580,214 | 4/1986 | Kubo et al. | 364/200 |
| 4,628,467 | 12/1986 | Nishi et al. | 364/521 |
| 4,648,077 | 3/1987 | Pinkham et al. | 365/240 |
| 4,663,619 | 5/1987 | Staggs et al. | 364/750 |
| 4,663,735 | 5/1987 | Novak et al. | 364/900 |
| 4,667,313 | 5/1987 | Pinkham et al. | 365/240 |
| 4,695,967 | 9/1987 | Kodama et al. | 364/521 |
| 4,747,081 | 5/1988 | Heilveil et al. | 365/219 |
| 4,858,107 | 8/1989 | Fedele | 364/200 |
| 4,876,663 | 10/1989 | McCord | 364/900 |
| 4,884,069 | 11/1989 | Farand | 340/799 |
| 4,924,415 | 5/1990 | Winser | 364/518 |

FOREIGN PATENT DOCUMENTS 265765 2/1984 Canada ................................ 354/232

Primary Examiner—Thomas C. Lee
Assistant Examiner—L. Donaghue
Attorney, Agent, or Firm—William F. Noval

[57] ABSTRACT

A method and apparatus for the handling of high speed data in which the data is routed to a plurality of memory arrays. In order to provide for the handling of a continuous stream of data at a high rate of speed, the memory arrays are arranged in two banks. Within each bank are groups of memory arrays connected in series. A control circuit is provided to direct even data to one group of memory arrays within a bank and odd data to another group within that bank, and to switch the data stream between banks such that there is no interruption in the acquisition of data.

14 Claims, 5 Drawing Sheets

MULTI-MEMORY BANK SYSTEM FOR RECEIVING CONTINUOUS SERIAL DATA STREAM AND MONITORING SAME TO CONTROL BANK SWITCHING WITHOUT INTERRUPTING CONTINUOUS DATA FLOW RATE

BACKGROUND OF THE INVENTION

1. Field of the Invention

The present invention relates to a method and apparatus for handling high speed data, and more particularly, to the handling of a continuous stream of high speed data.

2. Description of the Prior Art

Standard memory storage systems utilize bank switching, data latching, or FIFO techniques to read or write data into a read/write memory (RAM). These techniques are adequate for most applications; however, they require too much parallelism in architecture and circuitry overhead to be feasible for high speed applications. A normal memory cycle in a conventional RAM occurs at only 4 MHz. In certain applications, for example, in data acquisition from a high resolution CRT, it is necessary to acquire large amounts of continuous data at speeds greater than 40 MHz.

In U.S. Pat. No. 4,648,077, there is disclosed a serially accessed semiconductor memory which comprises four memory arrays disposed on a single semiconductor chip. A shift register is associated with each of the memory arrays, and transfer gates are disposed between the memory arrays and the shift registers. The patented device is primarily for use as a video memory in which the memory is pixel mapped such that one row of memory elements, or portion thereof, directly corresponds to the pixel information of a given scan line. The information in a row is accessed and stored in a shift register for serial output therefrom during a given scan line. A disadvantage of the disclosed arrangement is that when all of the data has been moved out of the shift registers, there must be a pause while new data is moved into the shift registers. A similar disadvantage exists when data is written into the device; that is, when the four shift registers have been filled, there must be a break in the data stream while the data is moved from the shift registers into memory. Thus, such an arrangement is not suitable for acquiring a continuous stream of data at a rate sufficient, for example, for acquiring data from a high resolution CRT.

SUMMARY OF THE INVENTION

It is an object of the present invention to overcome the problems in the prior art discussed above and to provide an improved method and apparatus for the handling of high speed data.

In accordance with one aspect of the invention, there is provided apparatus for handling high speed data, the apparatus comprising: a first memory bank having at least one memory array therein; a second memory bank having at least one memory array therein; control means for receiving a continuous stream of data in serial form, the control means being adapted to direct the data to a selected one of the banks and to a selected array in a bank, and the control means being adapted to change the flow of data from one bank to the other bank without interrupting the rate of flow thereof.

In accordance with another aspect of the present invention there is provided apparatus for handling high speed data, the apparatus comprising: a first memory bank having at least one memory array therein; a second memory bank having at least one memory array therein; control means for effecting the output of a continuous stream of data in serial form from the memory banks, the control means being adapted to effect the output of a stream of data from a memory array in a selected one of the banks, and the control means being adapted to stop the output from the one bank and to effect an output of a stream of data from a memory array in the other bank without interrupting the rate of flow of the stream of data.

In accordance with a still further aspect of the invention, there is provided a method for handling high speed data in apparatus having a plurality of banks of memory, each of the banks having a plurality of groups of memory arrays therein, each of the groups having at least one memory array, the method comprising the steps of: directing data to a selected one of the banks, the data being in the form of a continuous stream of pixels; directing successive pixels in the stream to successive shift registers in the one bank, each of the shift registers being associated with a memory array in one of the groups in the one bank; and shifting the pixel stream from the one bank to another bank when the shift registers in the one bank are full.

In one embodiment of the present invention, two banks of memory are provided and each of the banks includes a plurality of memory arrays. Memory arrays in each bank are designated for receipt of either even data or odd data. A shift register is associated with each of the memory arrays. The shift registers for memory arrays receiving even data are connected in series, and similarly, the shift registers for memory arrays receiving odd data are connected in series. A control circuit is provided for receipt of the high speed data and for alternately switching even data to the shift registers of memory arrays designated for even data and the odd data to the shift registers of memory arrays designated for odd data. When the shift registers of the one bank are full, the control means switches the data stream to the other bank.

A principal advantage of the present invention is that a continuous stream of data can be acquired in memory at very high speeds. The unique switching arrangement used in the invention makes it possible for the data to be acquired and moved into memory without any loss of data or interruption of the data stream. A further advantage of the present invention is that it is possible to use the same switching arrangement to provide for the output from memory of a continuous stream of high speed data.

Other features and advantages will become apparent upon reference to the following description of the preferred embodiment when read in light of the attached drawings.

DETAILED DESCRIPTION OF THE PREFERRED EMBODIMENT

Figure 1:
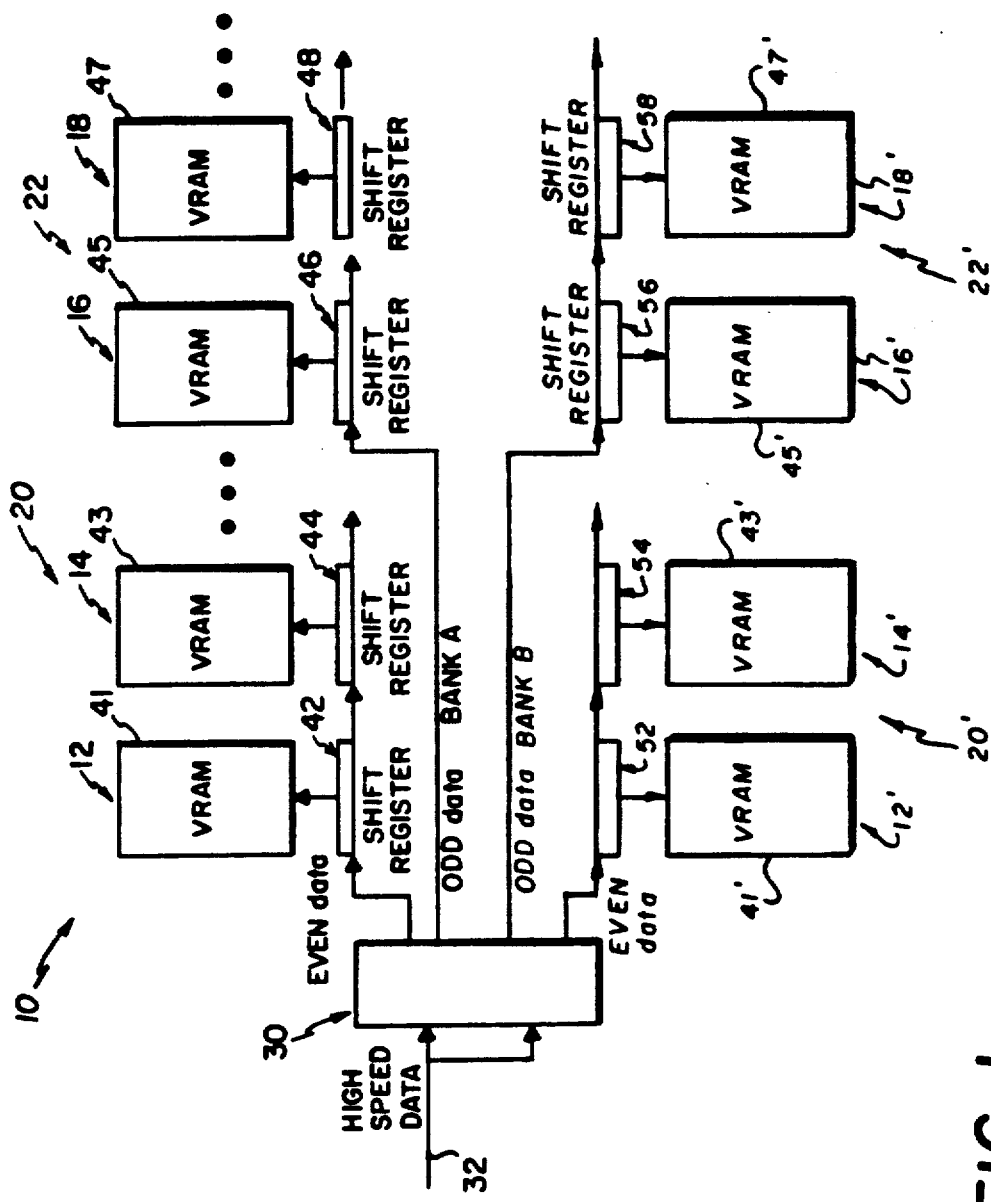
FIG. 1 is a schematic block diagram showing the apparatus of the present invention.

With reference to FIG. 1, there is shown apparatus 10 constructed in accordance with the present invention. Apparatus 10 is adapted to receive and store data entering the apparatus at a high rate of speed, and the apparatus is particularly suitable for receiving and storing data such as digitized images from a medical imaging device (not shown). The medical imaging device could be a computerized tomography scanner or a device for magnetic resonance imaging. Data elements, or pixels, entering the apparatus are written to memory in a first bank, designated bank A, or to memory in a second bank, designated bank B (not shown).

Bank A and bank B are identical, and thus, only bank A will be described herein in detail. Bank A comprises memory arrays 12, 14, 16, and 18. A group 20 of memory arrays, which includes arrays 12 and 14, are adapted to receive even data, i.e., pixels 0, 2, 4, etc., and a group 22 of memory arrays, which includes memory arrays 16 and 18, are adapted to receive odd data, i.e., pixels 1, 3, 5 etc.

In apparatus 10, the number of banks, the number of groups of memory arrays, and the number of memory arrays within a group can be changed to meet the needs of a particular application. The number of banks in apparatus 10 can be more than two, and the number of groups of memory arrays within each bank is not limited to two and can be more. Further, the number of memory arrays in groups 20 and 22 can be one, two (as shown in FIG. 1) or more. In general, if it is desired to increase memory, the number of memory arrays in a group should be increased; and as will be apparent from the discussion which follows, if it is desired to increase the speed of operation, the number of groups within a bank should be increased.

A control circuit 30 is adapted to receive high-speed data on a data bus 32 and to direct the data to either bank A or bank B. As will be apparent from the discussion which follows, the control circuit 30 is also adapted to direct data to one of the groups 20, 22, of memory arrays within bank A or to one of the groups of memory arrays in bank B (not shown).

Memory arrays 12, 14, 16, and 18 include read/write memories 41, 43, 45, and 47, respectively. Each of the read/write memories can be a 64 k bit dynamic RAM with two independent data ports. Memory arrays 12, 14, 16, and 18 also include shift registers 42, 44, 46, and 48, respectively. Each of the memory arrays 12–18 can be, for example, a VRAM (video random access memory) module, No. TM 4161EV4-15L, manufactured by Texas Instruments, Inc., Dallas, Tex.

Figure 2:
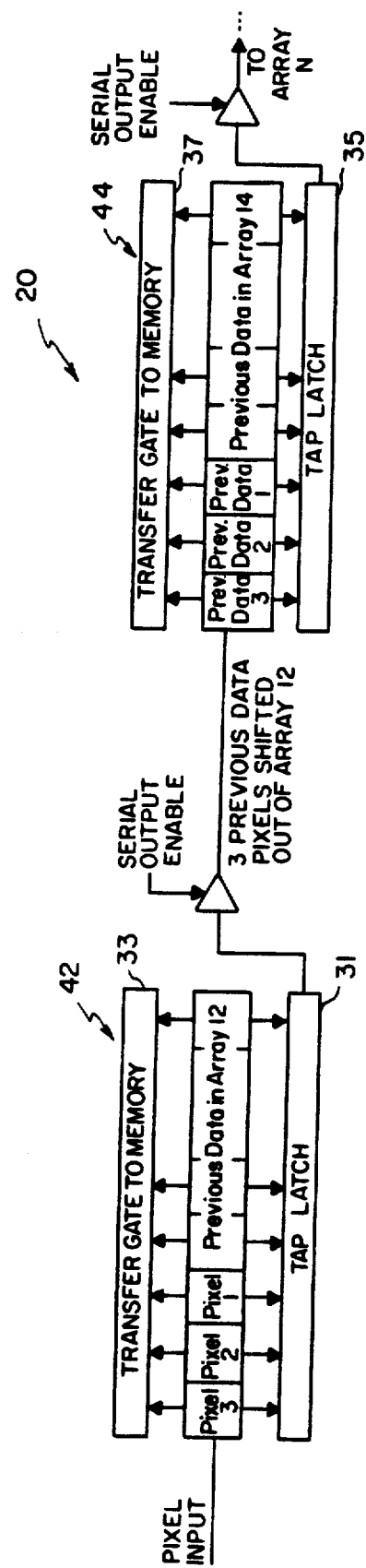
FIG. 2 is a schematic diagram showing the shift registers and tap latches in two memory arrays.

The shift registers within each group 20, 22, are connected in series, as shown in FIG. 2 for shift registers 42 and 44 in group 20. Each of the shift registers is a 256-bit shift register with its own input, output, and control signals. Shift registers 42 and 44 include tap latches 31 and 35, respectively, which are operable to select the shift bit of the associated shift register for output therefrom. Shift registers 42 and 44 also include transfer gates 33 and 37, respectively, which provide for the transfer of data between the shift registers and memory. Since the shift registers in each group 20, 22, are connected in series, any overflow caused by shifting a new pixel into a shift register 42, 44, results in a pixel being synchronously shifted out of the other end of the shift register. This feature permits the stacking of several memory arrays end to end to provide a larger acquisition memory size, and more importantly, extends the time required to fill all the shift registers. As will be explained below, when all registers in a bank are full, a shift register to memory transfer is required before new data can be accepted.

Figure 3A:
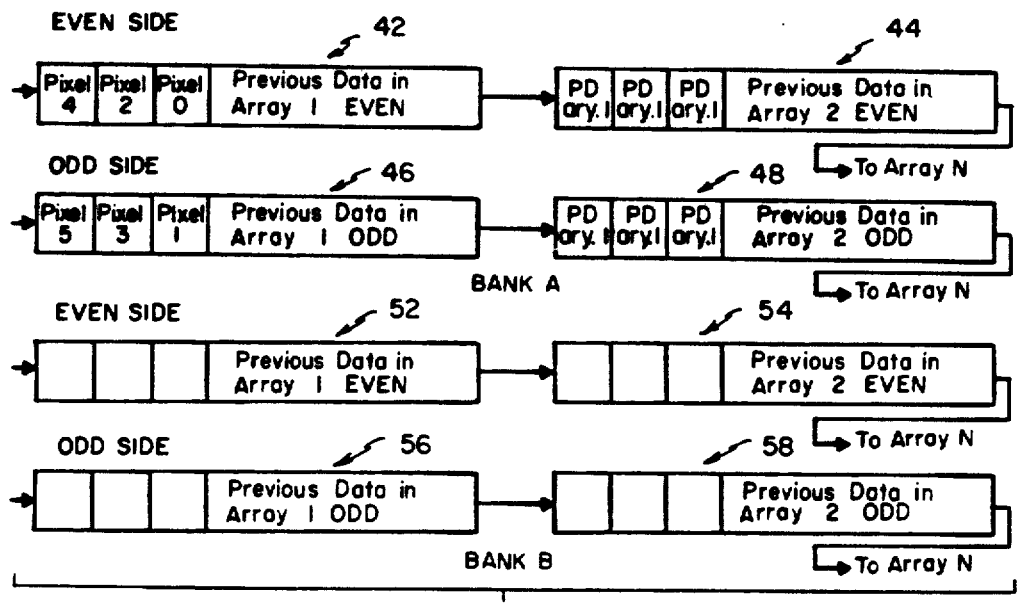
FIGS. 3a–3c illustrate one sequence of events in an acquisition mode of operation.
Figure 3B:
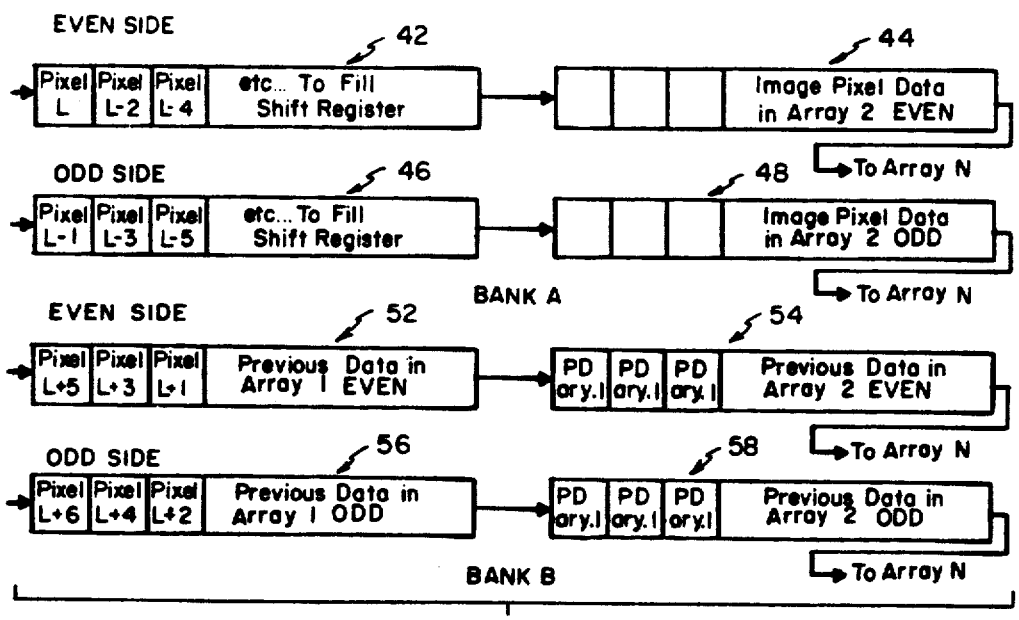
Figure 3C:
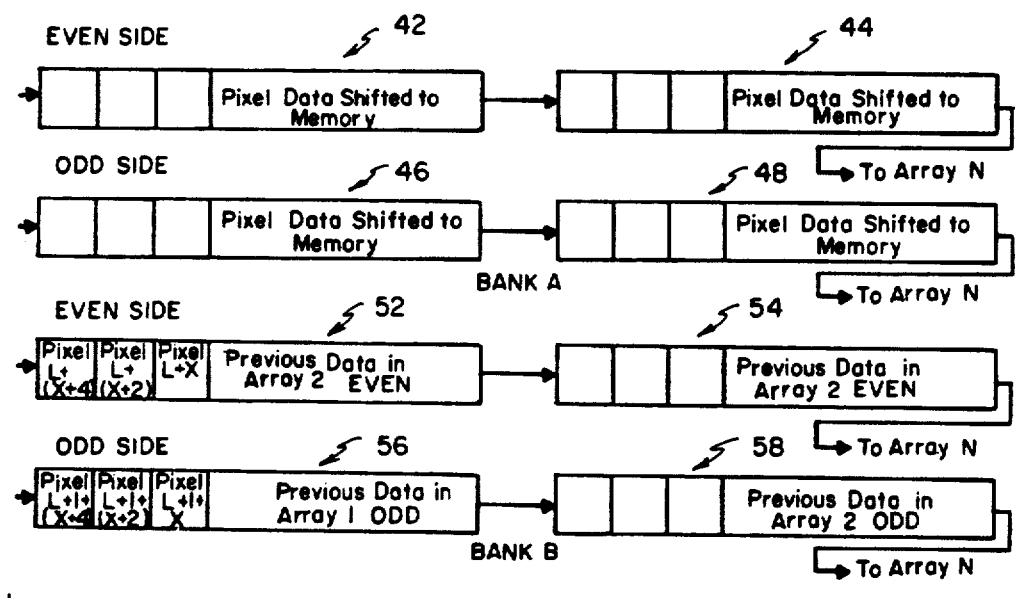

The sequence of operation of apparatus 10 is shown in FIGS. 3a through 3c. To illustrate the flow of data to the memory arrays in banks A and B, shift registers 42–48 are shown for bank A and shift registers 52–58 are shown for bank B. As noted above, shift registers 42 and 44 are in group 20 and are adapted to receive even pixels, and shift registers 46 and 48 are in group 22 and are adapted to receive odd pixels. Shift registers 52–58 are arranged in a like manner; that is, shift registers 52 and 54 are connected in series for one group of memory arrays in bank B (not shown) and are adapted to receive even pixels, and shift registers 56 and 58 are connected in series for a second group of memory arrays in bank B and are adapted to receive odd data.

As shown in FIG. 3a, the stream of data is routed first to bank A, with even pixels, that is pixels numbered 0, 2, 4 . . . , being routed to shift registers 42 and 44 within bank A, and the odd pixels, pixels 1, 3, 5 . . . , being routed to the shift registers 46 and 48 of bank A. When the shift registers 42–48 of bank A have been filled, as indicated in FIG. 3b by a last pixel L in register 42 and a next-to-last pixel L-1 in register 46, the stream of data is shifted to bank B. While the shift registers 52–58 of bank B are being filled in the manner just described for bank A, the data in shift registers 42–48 in bank A is shifted to the memories 41–47 in bank A (FIG. 3c). When the shift registers 52–58 in bank B have been filled, the data stream is shifted back to bank A, and the data in shift registers 52–58 in bank B is transferred to the memories (not shown) in bank B.

Figure 4:
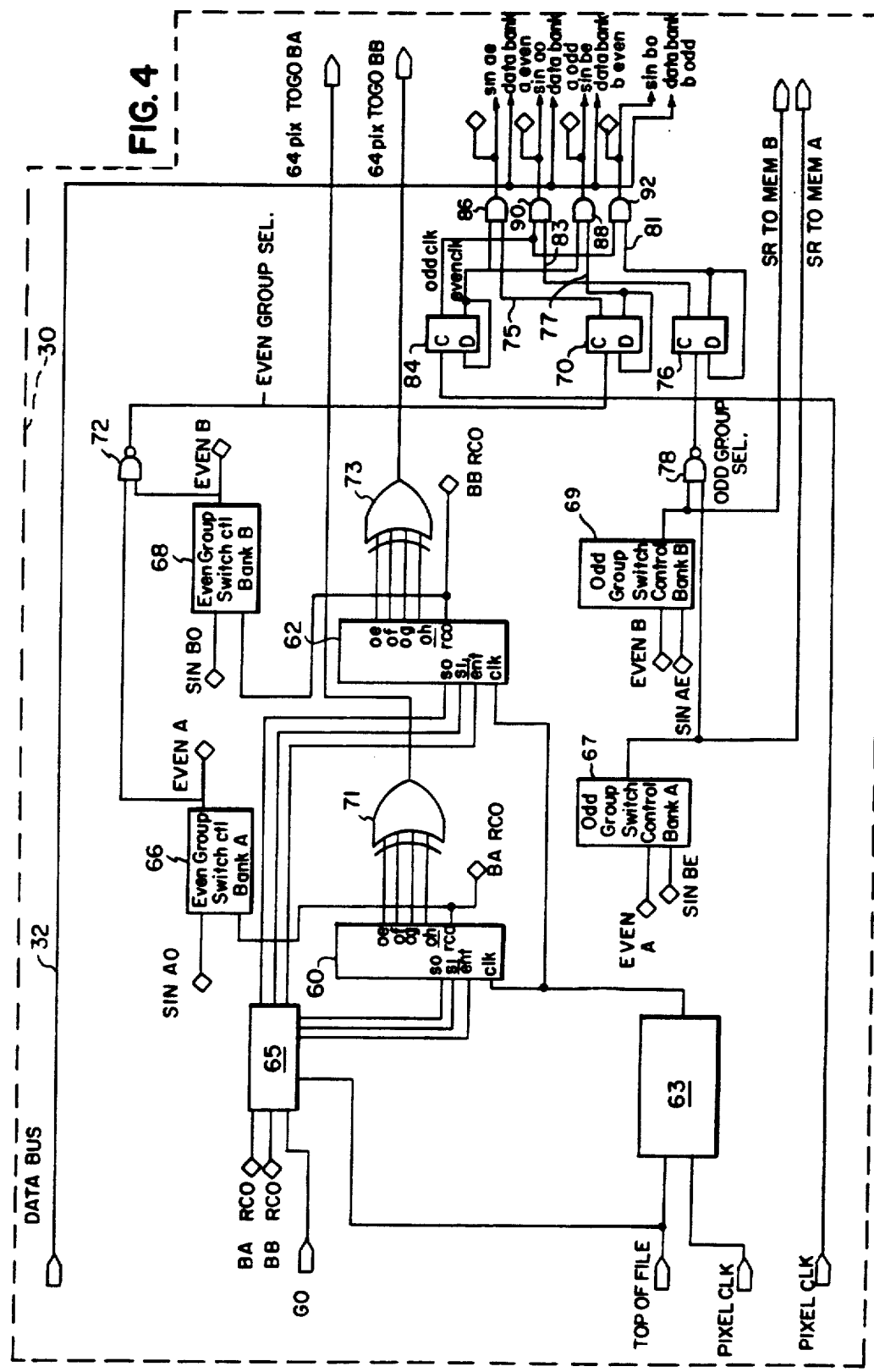
FIG. 4 is a schematic diagram of the control circuit of the present invention.

With reference to FIG. 4, there is shown a schematic diagram of control circuit 30 for performing the high speed switching of data within apparatus 10. The definitions of the symbols used in FIG. 4 are, as follows:

| | |
|---|---|
| GO | - Begin acquiring data after the next "Top of file" indication. |
| TOP_OF_FILE | - Top of file indicator. |
| SR_TO_MEM# | - Initiate a shift register to memory transfer for that bank. |
| ODD/EVEN_GRP_SEL | - Switch from one intrabank memory group to the corresponding group in the other bank. |
| BA/BB_RCO | - Bank A/Bank B Ripple Carry Out. |
| 64PIX_TOGO_# | - When 64 total pixels remain to be acquired in one bank all shift register to memory refresh cycles must be inhibited in the other bank so there will not be a collision when the bank switch occurs. |
| SIN AO/AE/BO/BE | - Clock signal for a group to accept new pixel. |

Upon receipt of the GO and TOP_OF_FILE signals, data on bus 32 begins to flow into bank A. Input data is acquired in an alternating fashion between an even group of memory arrays clocked by SIN AE and an odd group of memory arrays clocked by SIN AO, that is, the first pixel goes to even group 20 and the next pixel to odd group 22 (FIG. 1), etc. A counter 60 monitors the number of pixels which are loaded into bank A, and a counter 62 monitors the number of pixels which are loaded into bank B. A counter mode control 65 keeps track of the bank receiving data by means of an RCO signal from the counter monitoring that bank, and control 65 provides a reset signal to the counter which functions with the bank not receiving data. Clock signals are provided to counters 60 and 62 through a shift register counter controller 63. When bank A is nearly full, a 64PIX TOGO BA signal is provided through an exclusive OR gate 71 to bank B; this signal commands bank B to complete any current refresh cycle and to then remain idle because a bank switch is approaching. Similarly, when bank B is nearly full, a 64PIX_TOGO BB signal is provided to bank A through an exclusive OR gate 73.

The selection of a particular bank and a group within that bank to receive data is accomplished by the generation of a SIN clock signal for the group desired. To provide for the generation of a SIN clock signal, an input pixel clock (PIX_CLK) signal is provided to a D-type flip flop 84. Flip flop 84 divides the input pixel clock signal by 2, and its two outputs are the EVEN-/ODD intrabank input clocks. The EVEN_CLK signal is an input to AND gates 86 and 88, and the ODD_CLK signal is an input to AND gates 90 and 92. When the last pixel of even group 20 has been acquired, switching of the input channel from bank A to bank B is initiated. With only two intrabank memory groups (even/odd) there is only one input clock cycle time for this switch to occur. Upon receipt of the next input pixel clock signal (SIN AO), an even group switch control 66 effects the generation of a positive pulse (EVEN_GRP_SEL signal) which is provided through a NAND gate 72 to a D-type flip flop 70. When the EVEN_GRP_SEL signal is supplied to flip flop 70, the signal on a line 75 for group 20 is forced low and the signal on a line 77 for the even group of bank B (not shown) becomes high which effects the generation of a SIN BE signal from AND gate 88. A similar switch occurs after the last odd pixel has been acquired by group 22. An ODD_GRP_SEL signal from odd group switch control 67 is provided through a NAND gate 78 to a D-type flip flop 76. The outputs from flip flop 76 will then go high on line 81 and low on line 83 which effects the generation of a signal SIN BO from AND gate 92. Switch controls 68 and 69 function in the manner just described for controls 66 and 67, respectively, to effect a switch of data from bank B back to bank A.

From the foregoing, it will be seen that the switching sequence between banks A and B occurs, as follows: the last even pixel is accepted in group 20 of bank A, then the last odd pixel is accepted in group 22 of bank A while the bank A even group is switched, then the first even pixel is accepted in the even group (not shown) of bank B while the bank A odd group is switched, then the first odd pixel is accepted in the odd group (not shown) of bank B. Bank switching for even pixels occurs independently from switching for odd pixels. The time for the switch to occur must be less than the time from the last even/odd pixel from one bank to the first even/odd pixel into the other bank.

After the odd intrabank group has been switched as described above, bank A will not need to accept data until bank B is full and until 64PIX_TOGO is asserted; thus, there is time to perform a shift register to memory transfer in bank A by asserting SR TO_MEM A.

Data can be acquired in accordance with the present invention at a rate which can be found, as follows:

$$\text{Rate of Acquisition} = \frac{1}{\frac{1}{N(L)} + D}$$

where

N = No. of Groups of Memory Arrays in a Bank
L = I C limit of a Memory Array (MHz)
D = Propagation Delay of the Switching Logic (ns).

In the embodiment of the invention shown in FIG. 1 in which there are two groups of memory arrays in each bank, and each of the memory arrays 10 has an I C limit of 25 MHz, it has been found that the apparatus 10 can acquire data at a rate of about 45 MHz.

In the preceding description of the present invention, an input mode of operation has been described. However, it will be apparent to those skilled in the art that apparatus 10 can also function in an output mode in which data stored in memory arrays 12–18 is delivered in a continuous stream at a high rate of speed without any interruption in the rate of flow. In an output mode, the steps performed in producing a continuous stream would be just the reverse of those described herein for the input mode. Thus, in an output mode, data from memory would first be shifted into the shift registers in one of the banks, and pixels from the registers in the even and odd groups in this bank would be then be alternately shifted out. When the shift registers of the bank were empty, switches to the corresponding even and odd groups in another bank would be effected in the manner described above.

This invention has been described in detail with particular reference to a preferred embodiment thereof. However, it will be understood that variations and modifications can be effected within the spirit and scope of the invention.

I claim:

1. Apparatus for handling high speed data, said apparatus comprising:
   a first memory bank having a plurality of memory arrays for storing data therein;
   a second memory bank having a plurality of memory arrays for storing data therein; and
   control means operatively coupled to said memory banks for receiving a continuous stream of data in serial form and for directing said data to a selected one of said banks and to a selected array in the selected one bank for storage therein, said control means including means for monitoring the number of elements of data in the selected one bank and means for generating a signal when the number of elements of data in the selected one bank have reached a predetermined level, and said control means further including means responsive to said signal for changing the stream of data from the selected one bank to the other bank without interrupting the rate of continuous flow thereof.

2. Apparatus, as defined in claim 1, wherein said memory arrays are VRAMS.

3. Apparatus, as defined in claim 1, wherein said monitoring means comprises counter means for counting elements of data in said stream.

4. Apparatus, as defined in claim 1, wherein each of said first and second memory banks has at least two groups of memory arrays, and each group includes at least one memory array.

5. Apparatus, as defined in claim 4, wherein each of said memory arrays has a shift register associated there-with, and the shift registers of the memory arrays in each group are connected in series.

6. Apparatus, as defined in claim 4, wherein each of said memory banks has n groups of memory arrays, and said control means includes means for directing every nth element of data to a memory array in one of said n groups.

7. Apparatus, as defined in claim 4, wherein one of said groups in each bank is adapted to receive even data and another of said groups in each bank is adapted to receive odd data.

8. Apparatus, as defined in claim 7, wherein said control means is adapted to change the flow of data from the group in one bank which is adapted to receive even data to the group in the other bank which is adapted to receive even data.

9. Apparatus, as defined in claim 7, wherein said control means is adapted to change the flow of data from the group in one bank which is adapted to receive odd data to the group in the other bank which is adapted to receive odd data.

10. A method for handling high speed data in apparatus having a plurality of banks of memory, each of said banks having a plurality of groups of memory arrays therein, each of said groups having at least one memory array, said method comprising the steps of:
- directing data to a selected one of said banks, said data being in the form of a continuous stream of pixels;
- directing successive pixels in said stream to successive shift registers in said one bank, each of said shift registers being associated with a memory array in one of the groups in said one bank;
- monitoring the number of pixels in said one bank and generating a signal when the number of pixels in the one bank have reached a predetermined level; and
- shifting the pixel stream, in response to said signal, from said one bank to another bank when said shift registers in said one bank are full without interrupting the rate of flow of said pixel stream.

11. A method, as defined in claim 10, wherein each of said banks contains two groups of memory arrays, and even pixels in said stream are directed to a shift register associated with a memory array in one of said groups and odd pixels are directed to a shift register associated with a memory array in the other group.

12. A method, as defined in claim 10, wherein the pixels in the shift registers in said one bank are transferred to memories in said arrays after the pixel stream is shifted to said other bank.

13. Apparatus for handling high speed data, said apparatus comprising:
- a first memory bank having a plurality of memory arrays for storing data therein;
- a second memory bank having a plurality of memory arrays for storing data therein; and
- control means operatively coupled to said memory banks for effecting an output of a continuous stream of data in serial form from said memory banks, said control means including means for effecting the output of a stream of data from a memory array in a selected one of said banks and means for monitoring the number of elements of data in the selected one of said banks and for generating a signal when the number of elements of data have reached a predetermined level, and said control means further including means for stopping the output from said selected one bank in response to said signal and effecting an output of a stream of data from a memory array in the other bank without interrupting the rate of continuous flow of said stream of data.

14. Apparatus for handling high speed data, said apparatus comprising:
- a first memory bank having a plurality of memory arrays for storing data therein;
- a second memory bank having a plurality of memory arrays for storing data therein; and
- control means operatively coupled to said memory banks for controlling the input of a continuous stream of data to said memory banks and for controlling the output of a continuous stream of data from said memory banks, said control means including means for controlling the input of data to a memory array in a selected one of said banks and for controlling the output of data from a memory array in a selected one of said banks, said control means including means for monitoring the number of elements of data in said banks and for generating a signal when the number of elements of data in a bank is at a predetermined level, and said control means including switching means operative in response to said signal for changing the stream of data from said one bank to the other bank without interrupting the rate of continuous flow of the stream of data.

* * * * *